United States Patent [19]
Hatley

[11] Patent Number: 6,100,711
[45] Date of Patent: Aug. 8, 2000

[54] MINIATURE AIR GAP INSPECTION DEVICE

[75] Inventor: Kenneth J. Hatley, Madison, N.J.

[73] Assignee: General Electric Co., Schenectady, N.Y.

[21] Appl. No.: 09/046,563

[22] Filed: Mar. 24, 1998

[51] Int. Cl.[7] .......................... G01R 31/34; G01R 31/06
[52] U.S. Cl. ............................................ 324/772; 324/545
[58] Field of Search ...................................... 324/772, 545

[56] References Cited

U.S. PATENT DOCUMENTS

| 5,365,166 | 11/1994 | Dailey et al. | 324/545 |
| 5,557,216 | 9/1996 | Dailey et al. | 324/772 |
| 5,650,579 | 7/1997 | Hatley et al. | 73/865.8 |
| 5,969,531 | 10/1999 | Murakami et al. | 324/545 |

*Primary Examiner*—Glenn W. Brown
*Attorney, Agent, or Firm*—Nixon & Vanderhye

[57] ABSTRACT

A miniature air gap inspection device permits in-situ inspection of a generator field and stator core having entrance gaps as little as 0.5" and larger. The inspection device passes through a radial air gap between a core iron and a retaining ring of the generator, and thus, removal of the generator field is not necessary. The device includes a tractor section having a tractor frame attachable to the retaining ring for selective circumferential positioning about the field. A mast section is coupled with the tractor frame and includes an extendible mast. An inspection head is attached to the extendible mast and is axially extended and retracted in the gap by the mast. The inspection head supports at least one inspection tool for performing the in-situ generator inspections.

19 Claims, 6 Drawing Sheets

400;6,100,711

MINIATURE AIR GAP INSPECTION DEVICE

FIELD OF THE INVENTION

The invention relates to a miniature air gap inspection device for in-situ inspection of a generator stator and field.

BACKGROUND

The visual inspection of a generator field, stator and wedge tightness, as well as electrical testing, should be performed on a periodic basis. Conventional generator/stator inspection and testing procedures typically require the complete disassembly of the stator and removal of the generator field from the stator before any inspections or tests can be performed on the unit. The cost of disassembly and removal of the field, the time it takes for this process, and the dangers of field removal have lead to the omission of the generator and stator examinations from outage schedules.

In-situ inspections of generators have been performed employing poles, trolleys and field turning techniques. These procedures have not accomplished the inspection task in a completely satisfactory manner.

A miniature air gap inspection crawler is disclosed in U.S. Pat. No. 5,650,579, the contents of which are hereby incorporated by reference. In this arrangement, a miniature crawler is designed to pass through the radial air gap between the core iron and the retaining ring for in-situ inspection of the field and stator core. The crawler can be collapsed for insertion into an entrance gap of 1.125" and is driven by tracks to a selected axial location. The crawler is then expanded at a desired circumferential position in the air gap. Video cameras and other inspection tools attached to the crawler are used to perform generator field and stator core inspections in the air gap.

This inspection crawler, however, cannot be used with the many existing generators that have entrance gaps smaller than 1.125". As such, inspection of these generators requires the complete disassembly of the stator and removal of the generator field from the stator before any inspections can be performed on the unit.

DISCLOSURE OF THE INVENTION

The inspection device according to the present invention is designed to pass through the radial air gap between the core iron and the retaining ring, requiring a minimum entrance gap of 0.5". The inspection device is driven circumferentially by the use of belts and motor driven gears and propelled axially through the gap by the use of special pulleys and motorized cable wheels that are attached to an extendible mast. Once inserted into the air gap, the device can be expanded into the slot and remain in place by a force applied by two spring return pneumatic rams or the like. Full inspection coverage of the core ID and field surface is made possible by the device's axial motion capability.

A high-resolution video camera provides the operator with a clear view of the stator core laminations, stator wedges, field wedges and the in-board ends of the retaining rings. The device thus provides detection capability for loose stator wedges, vibration bar sparking, core lamination damage due to foreign objects, motoring and hot spots, field wedge arcing and surface heating damage. Through the generator in-situ inspection, information is gathered on the generator condition that can help determine if field removal is necessary.

Other tools may be utilized with the inspection device such as a wedge tapping device, which is used to measure the tightness of stator slot wedges, and an ELCID coil for the inspection of shorted stator punchings.

These and other features and advantages of the invention are achieved by providing a miniature air gap inspection device for inspection of a generator stator and a generator field with the generator field in place. The inspection device passes through a radial air gap between a core iron and a retaining ring of the generator. The inspection device includes a tractor section having a tractor frame attachable to the retaining ring for selective circumferential positioning about the field. A mast section is coupled with the tractor frame and includes an extendible mast. An inspection head is coupled with the extendible mast and supports at least one inspection tool for performing in-situ generator inspections.

In accordance with another aspect of the invention, there is provided a miniature air gap inspection device for insertion into a radial air gap between a core iron and a retaining ring of a generator. The miniature air gap inspection device includes a tractor attachable to the retaining ring, and an inspection assembly coupled with the tractor. The inspection assembly includes a shoe sled and supports at least one inspection tool for performing in-situ generator inspections. The shoe sled is contractable to fit into the radial air gap.

DESCRIPTION OF THE DRAWINGS

These and other aspects and advantages of the present invention will be described in detail with reference to the accompanying drawings, in which.

BEST MODE FOR CARRYING OUT THE INVENTION

Figure 1:
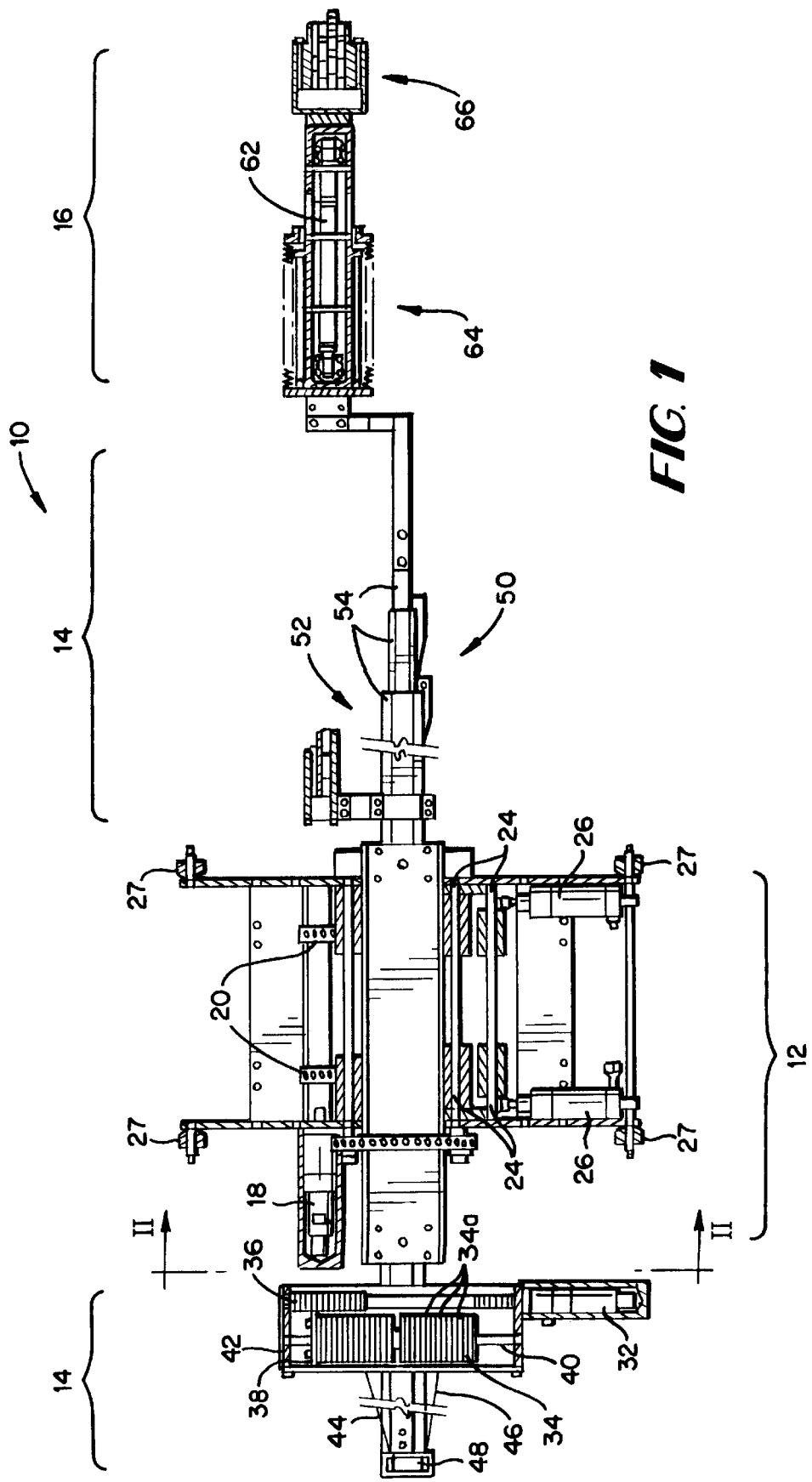
FIG. 1 is a top plan view of the miniature air gap inspection device according to the present invention.

FIG. 1 is a top plan view of the miniature air gap inspection device according to the present invention. Generally, the device 10 according to the invention includes a tractor section 12, a mast section 14, and an inspection head 16. The tractor section 12 is controlled to circumferentially position the device about the field. The mast section 14 is attached to the tractor section 12 and serves to position the inspection head 16 axially in the air gap. The inspection head 16 is attached for axial movement with the mast section 14 and supports at least one inspection tool.

Figure 2:
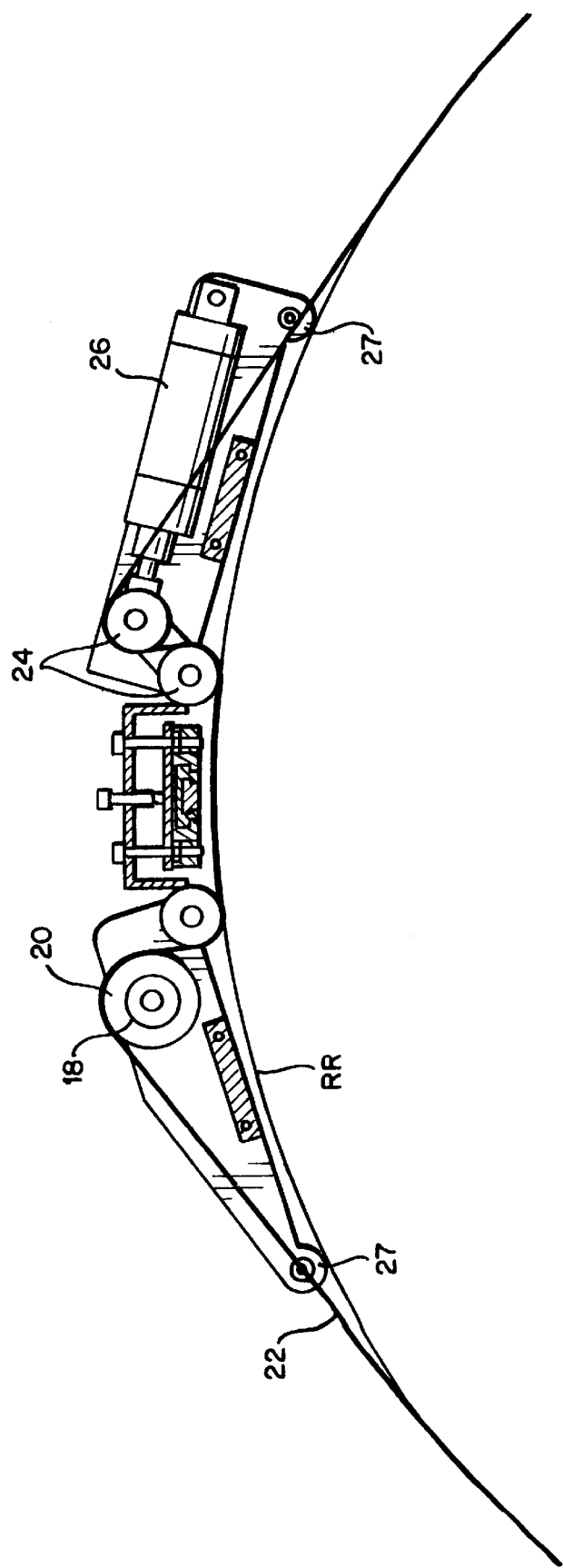
FIG. 2 is a side view of the tractor section in the device according to the invention.

FIG. 2 is a side view of the tractor section 12 along the line II—II in FIG. 1. The tractor section 12 uses a DC motor 18 that transfers power to two joined drive gears 20. The drive gears 20 roll along tracks 22 in a circumferential direction around the retaining ring RR. Slack in the drive tracks 22 is removed by routing the tracks 22 over two idle pulleys 24, respectively. The pulleys 24 are positioned at the end of two pneumatic air rams 26, respectively. The air rams 26 are activated via pressurized air, and the rams 26 push the pulleys 24 against the tracks 22. The tractor section 12 is carried by wheels 27 as it is driven circumferentially about the retaining ring RR.

Clockwise and counterclockwise motion of the device along the tracks 22 and circumferential speed about the retaining ring is controlled by the operator at a control panel (not shown). The control panel has a series of switches and displays that help the operator control the air pressure for the track tensioners and the circumferential position of the device.

Figure 3:
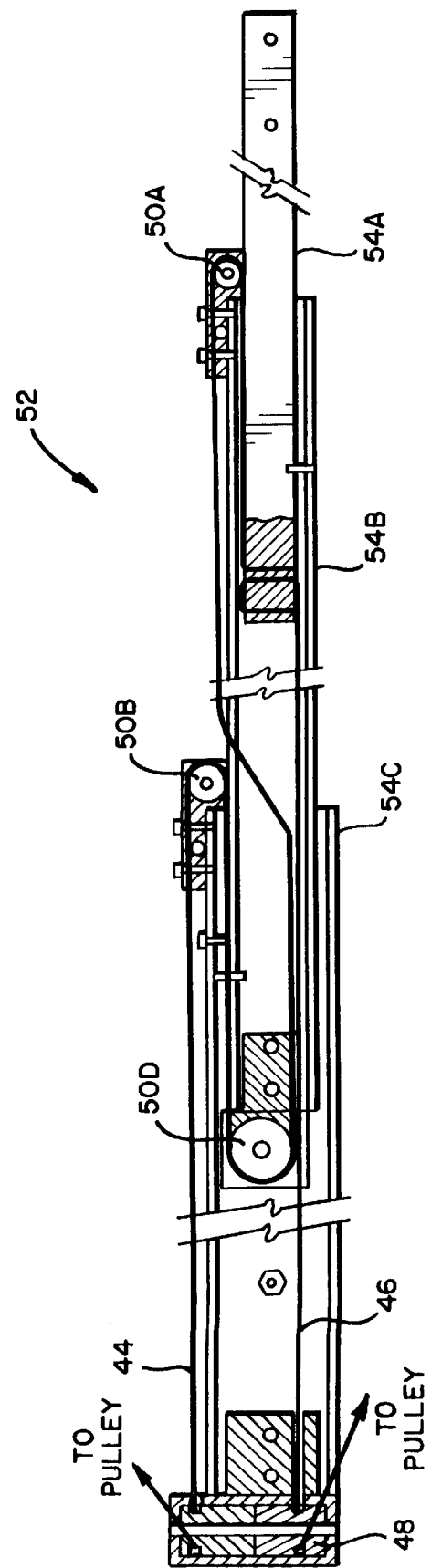
FIG. 3 is a sectional view of the mast section.

With reference to FIG. 3 and continued reference to FIG. 1, the mast section 14 utilizes a DC motor 32 that transfers power to a split threaded tensioning drum 34 via a drive gear 36 engaging an idler gear 38 attached at one end of the drum 34. The drum 34 is rotated on a threaded axle 40 mounted in a frame 42 such that the drum 34 moves side to side within the frame 42 at a rate determined by the pitch of the threaded axle 40. A pair of cables 44, 46 are wound and unwound on the drum 34 in grooves 34a formed on the drum 34. The grooves 34a are spaced at a pitch corresponding to the pitch of the threaded axle 40 so that the cables 44, 46 are wound in the grooves 34a of the drum 34, and overlapping of the cables 44, 46 is prevented.

One of the cables, e.g., cable 44, is wound over the drum 34 while the other of the cables, e.g., cable 46, is wound under the drum 34. As such, while winding the drum 34 in either direction, one of the cables 44, 46 is driving the mast while the other is idle. In this context, as the drum turns in one direction, one of the cables rolls off the drum as the other of the cables rolls on the drum. The cables 44, 46 extend over a first pulley 48 to a pulley system 50 that drives an extendible mast 52. The mast 52 consists of a plurality of telescoping sections 54, preferably three flat rods, which slide within one another allowing the mast 52 to become longer and shorter. As the drum 34 is driven in a first direction, the first cable 44 extends the mast 52 in an axial direction along the generator. Reversing the motor causes the second cable 46 to retract the mast 52.

FIG. 3 is a sectional view through the mast. The mast sections include a first section 54A that telescopes within a second section 54B. The first cable 44 comes from the tensioning drum 34 around the first pulley 48 and then travels a serpentine route around pulleys 50B, 50D and 50A and is then attached to an end of the first section 54A. The second cable 46 extends directly from the end of the first section 54A around pulley 50E to the tensioning drum 34. Other configurations of the pulley system 50 may be contemplated, and the invention is not meant to be limited to the disclosed arrangement.

Figure 4:
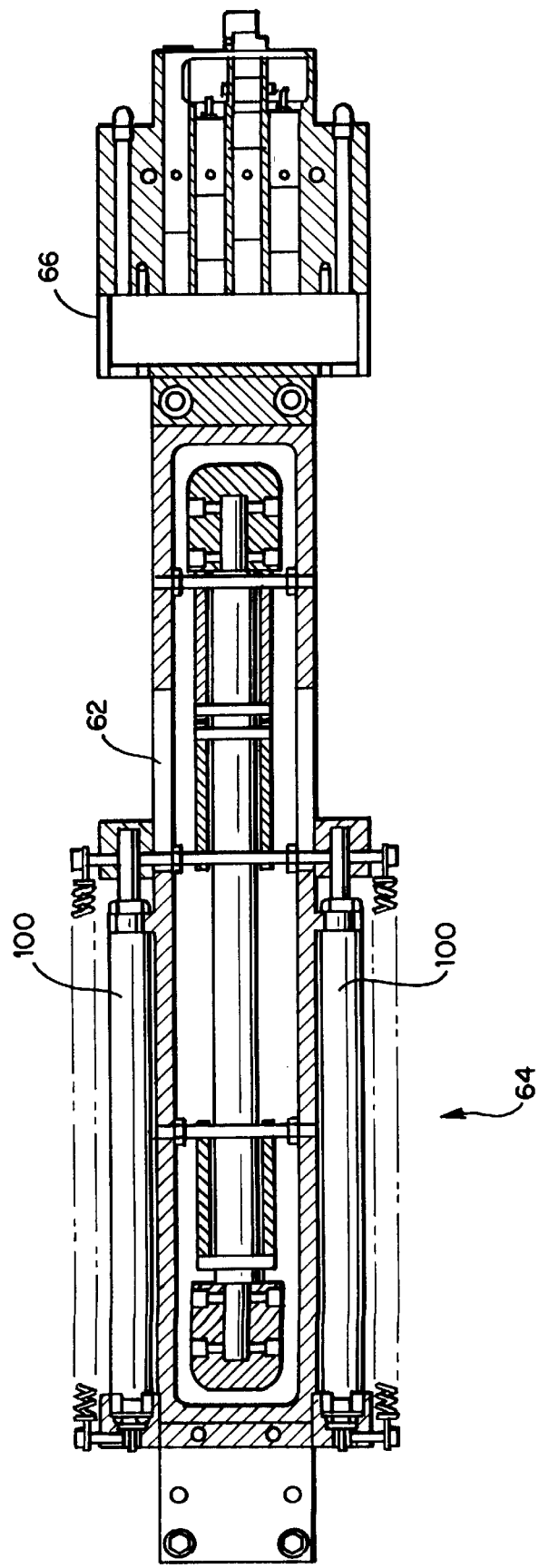
FIG. 4 is a plan view of the inspection head according to the invention.
Figure 4A:
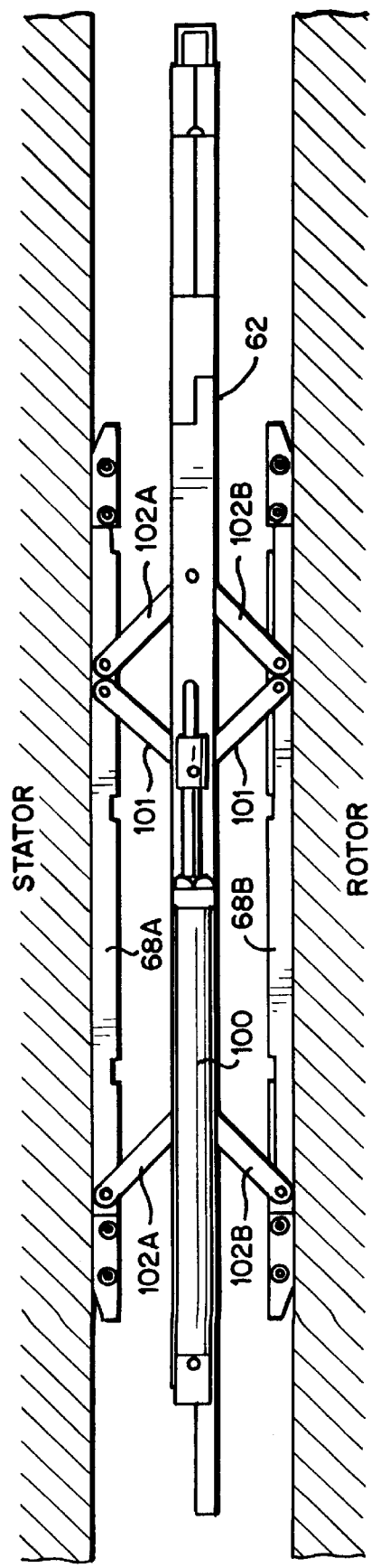
FIG. 4A is a side view of the inspection head.

FIG. 4 is a plan view of the inspection head according to the present invention, and FIG. 4A is a side view of the inspection head. The inspection head 16 is attached to the mast section 14, and more particularly to one of the telescoping rods 54, and moves axially with the extension and retraction of the mast 52. The inspection head 16 includes a central support member or inspection head base 62 supporting a sled 64 and a camera assembly 66.

The sled 64 consists of two shoes 68A, 68B that are expandable and contractable by any suitable structure such as gears and levers or the like. Preferably, the shoes 68A, 68B sit flat together in the center of the inspection head 16 and are attached to two pneumatic spring return air rams 100 acting on links 101. When air is applied to the pneumatic rams 100, the shoes 68A, 68B separate to expand the sled 64 with one shoe coming in contact with the generator field, and the other extending into the stator slots. Links 102A are arranged parallel to each other so that the shoe 68A expands parallel to the central support member 62. Similarly, links 102B cause shoe 68B to expand parallel to the central support member 62. In a fully contracted position, the inspection head is sized to fit into a 0.5" gap. The shoes 68A, 68B serve to stabilize the inspection tool(s) in the gap and center the camera assembly 66. The camera assembly 66 is attached to the central support member 62 at a position that is axially forward of the sled 64.

With the shoes 68A, 68B expanded, axial movement can be initiated to begin the inspection. At least the shoe on the field side of the sled 64 is coated with teflon or the like to facilitate sliding of the expanded sled in the gap.

When the gap has been completely inspected, the mast 52 is retracted to return the inspection head 16 to its starting position, the shoes 68A, 68B of the sled 64 are contracted, and the inspection head 16 is moved circumferentially to the next slot by the tractor section 12. The process is then repeated until all slots have been inspected.

Similar to the camera assembly disclosed in the above-noted '579 patent, the camera assembly 66 contains a forward view camera of fixed focus used for navigation and detection and a variable view camera with a power focus assembly and a right angle prism to allow for viewing of stator and rotor surfaces. The details of the camera are not pertinent to the present invention and will not be further described.

Figure 5:
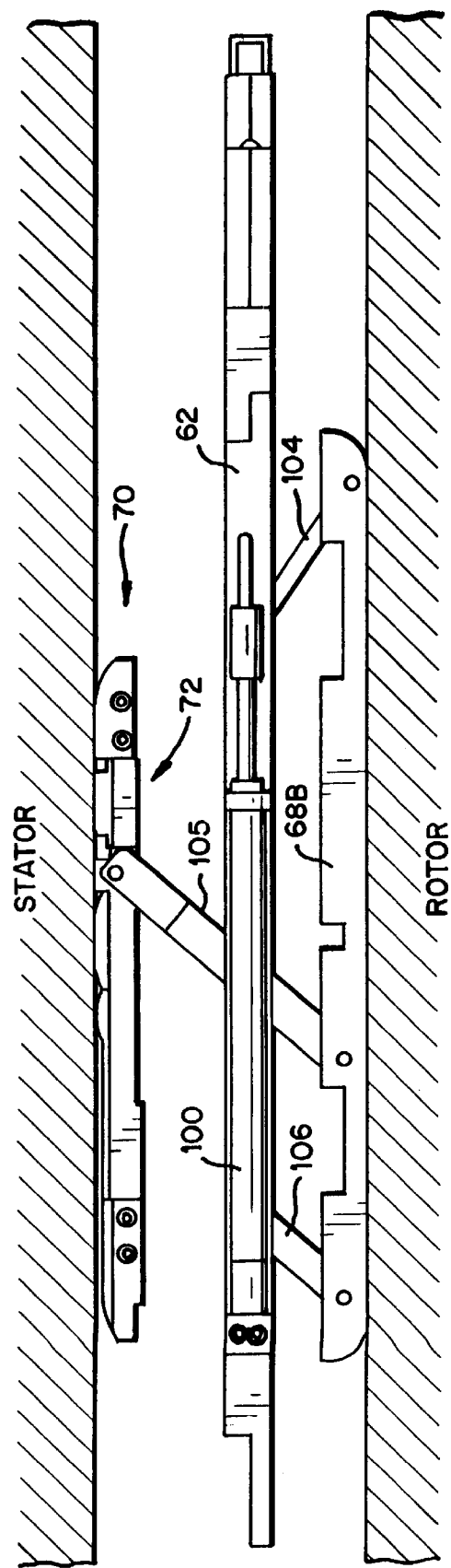
FIG. 5 shows an auxiliary shoe of the inspection head.

When wedge tightness inspections are performed, a separate shoe assembly is used that includes a wedge tapping module. FIG. 5 illustrates the sled 64 with an auxiliary shoe 70 including a wedge tapping module 72. The auxiliary shoe 70 replaces the stator side shoe 68A. The auxiliary shoe 70 is thus structured to stabilize the sled 64 and center the camera assembly 66 in the same manner as the shoe 68A. The link mechanism in this arrangement may be different, however, to enable the wedge tapping module to align against the wedge. In this configuration, air rams 100 act on link 104, which in turn causes shoe 68B to rotate links 105, 106. The links 105, 106 remain parallel with each other causing shoe 68B to remain parallel with the central support member 62. The wedge tapping module is pivotally mounted to link 105. The wedge tapping module 72 is conventional, and the details and operation thereof will not be further described. With this structure, the inspector can perform the visual inspection and wedge tapping test simultaneously as the sled and camera assembly are moved axially down the slot, stopping at each wedge to perform the tightness test.

The inspection head 16 may alternatively or additionally carry an ELCID coil for inspecting shorted stator punchings. The ELCID coil is conventional and will not be further described. Those of ordinary skill in the art will appreciate that alternative inspection tools may also be supported by the inspection head, and the invention is not meant to be limited to the disclosed embodiments.

The miniature air gap inspection device according to the present invention permits in-situ inspection of the generator field and stator core with entrance gaps of as little as 0.5" and larger. The inspection can be performed without rotation of the generator field, and valuable information can be gathered on the generator condition without requiring removal of the field. As noted, the inspection device is also designed to carry an auxiliary inspection tool such as a wedge tapping device and/or an ELCID coil for measuring the tightness of stator slot wedges and for inspection of shorted stator punchings, respectively.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A miniature air gap inspection device for inspection of a generator stator and a generator field with the generator field in place, the inspection device passing through a radial air gap between a core iron and a retaining ring of the generator, the inspection device comprising:
 a tractor section having a tractor frame that is selectively attached to the retaining ring for circumferential positioning about the field;
 a mast section coupled with the tractor frame and comprising an extendible mast; and
 an inspection head coupled with the extendible mast, the inspection head supporting at least one inspection tool for performing in-situ generator inspections.

2. A miniature air gap inspection device according to claim 1, further comprising a drive track disposed around the retaining ring and coupled with the tractor frame, the tractor section including drive structure engaging the drive track.

3. A miniature air gap inspection device according to claim 2, wherein the tractor section comprises a drive track tensioning device engaged with the drive track.

4. A miniature air gap inspection device according to claim 3, wherein the drive track tensioning device comprises a pulley attached to an extendible ram coupled with the tractor frame, the drive track extending over the pulley.

5. A miniature air gap inspection device according to claim 2, comprising a pair of drive tracks disposed around the retaining ring and coupled with the tractor frame, wherein the drive structure comprises a pair of drive gears attached to the tractor frame and engaging the pair of drive tracks, respectively.

6. A miniature air gap inspection device according to claim 1, wherein the mast section comprises a mast driver coupled with the extendible mast, the mast driver driving in a first direction to extend the extendible mast and in a second direction to retract the extendible mast.

7. A miniature air gap inspection device according to claim 1, wherein the inspection head comprises an upper skid and a lower skid movably coupled with an inspection head base, the upper and lower skids being expandable and contractible relative to each other.

8. A miniature air gap inspection device according to claim 7, wherein the upper skid and the lower skid are contractible to fit into a 0.5" gap.

9. A miniature air gap inspection device according to claim 7, wherein the inspection head further comprises a pneumatic spring return air ram coupled between the inspection head base and the upper skid and the lower skid, the pneumatic spring return air ram, when deactivated, urging the upper and lower skids toward a contracted position.

10. A miniature air gap inspection device according to claim 7, wherein the at least one inspection tool is attached to the inspection head base.

11. A miniature air gap inspection device according to claim 10, wherein the inspection tool comprises a camera assembly.

12. A miniature air gap inspection device according to claim 11, wherein the upper skid is positioned to engage the stator and comprises a wedge tapping shoe including a wedge tapping module.

13. A miniature air gap inspection device according to claim 7, wherein the upper skid is positioned to engage the stator and comprises a wedge tapping shoe including a wedge tapping module.

14. A miniature air gap inspection device for insertion into a radial air gap between a core iron and a retaining ring of a generator, the miniature air gap inspection device comprising:
 a tractor that is selectively attached to the retaining ring; and
 an inspection assembly coupled with the tractor, the inspection assembly including a shoe sled and supporting at least one inspection tool for performing in-situ generator inspections, wherein the shoe sled is contractible to fit into the radial air gap.

15. A miniature air gap inspection device according to claim 14, wherein the shoe sled is contractible to fit into a 0.5" gap.

16. A miniature air gap inspection device according to claim 14, further comprising an extendible mast coupled at one end to the tractor and at an other end to the inspection assembly, the mast controlling an axial position of the inspection assembly.

17. A miniature air gap inspection device according to claim 14, further comprising a drive track disposed around the retaining ring and coupled with the tractor, the tractor including drive structure engaging the drive track.

18. A miniature air gap inspection device according to claim 17, wherein the tractor comprises a drive track tensioning device engaged with the drive track.

19. A miniature air gap inspection device for inspection of a generator stator and a generator field with the generator field in place, the inspection device passing through a radial air gap between a core iron and a retaining ring of the generator, the inspection device comprising:
 a tractor section having a tractor frame attachable to the retaining ring for selective circumferential positioning about the field;
 a mast section coupled with the tractor frame and comprising an extendible mast; and
 an inspection head coupled with the extendible mast, the inspection head supporting at least one inspection tool for performing in situ generator inspections, wherein the mast section and the inspection head are sized to fit inside the air gap between the core iron and the retaining ring of the generator, the tractor section positioning the mast section and inspection head in a desired circumferential position within the air gap.

* * * * *